(12) United States Patent
Fujihira

(10) Patent No.: US 7,253,476 B2
(45) Date of Patent: Aug. 7, 2007

(54) SEMICONDUCTOR DEVICE WITH ALTERNATING CONDUCTIVITY TYPE LAYER AND METHOD OF MANUFACTURING THE SAME

(75) Inventor: Tatsuhiko Fujihira, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 18 days.

(21) Appl. No.: 11/035,819

(22) Filed: Jan. 14, 2005

(65) Prior Publication Data

US 2005/0156235 A1 Jul. 21, 2005

(51) Int. Cl.
*H01L 29/76* (2006.01)
*H01L 29/94* (2006.01)

(52) U.S. Cl. ...................... 257/341; 257/492

(58) Field of Classification Search ........ 257/341–342, 257/330–331, 492–493, E29.076, E29
See application file for complete search history.

(56) References Cited

U.S. PATENT DOCUMENTS 6,040,600 A * 3/2000 Uenishi et al. ............. 257/330
6,081,009 A * 6/2000 Neilson ...................... 257/341
6,271,562 B1 * 8/2001 Deboy et al. ............... 257/341

* cited by examiner

*Primary Examiner*—Theresa T. Doan
(74) *Attorney, Agent, or Firm*—Baker Botts LLP

(57) ABSTRACT

A semiconductor device having an alternating conductivity type layer improves the tradeoff between the on-resistance and the breakdown voltage and facilitates increasing the current capacity by reducing the on resistance while maintaining a high breakdown voltage. The semiconductor device includes a semiconductive substrate region, through which a current flows in the ON-state of the device and that is depleted in the OFF-state. The semiconductive substrate region includes a plurality of vertical alignments of n-type buried regions 32 and a plurality of vertical alignments of p-type buried regions. The vertically aligned n-type buried regions and the vertically aligned p-type buried regions are alternately arranged horizontally. The n-type buried regions and p-type buried regions are formed by diffusing respective impurities into highly resistive n-type layers 32a laminated one by one epitaxially.

4 Claims, 16 Drawing Sheets

SEMICONDUCTOR DEVICE WITH ALTERNATING CONDUCTIVITY TYPE LAYER AND METHOD OF MANUFACTURING THE SAME

FIELD OF THE INVENTION

The present invention relates to a vertical semiconductor structure that facilitates realizing both a high breakdown voltage and a high current capacity in insulated gate field effect transistors (MOSFETs), insulated gate bipolar transistors (IGBTs), bipolar transistors, diodes and such semiconductor devices. The present invention also relates to a method of manufacturing the semiconductor device with such a vertical semiconductor structure.

BACKGROUND OF THE INVENTION

Semiconductor devices may be roughly classified as lateral semiconductor devices wherein electrodes are arranged on a major surface and vertical semiconductor devices wherein electrodes are distributed on both major surfaces opposing each other. When the vertical semiconductor device is ON, a drift current flows in the expansion direction of a drift layer, which becomes depleted by the reverse bias voltage when the vertical semiconductor device is OFF. FIG. 19 is a cross section of a conventional planar n-channel vertical MOSFET. Referring now to FIG. 19, this vertical MOSFET includes a drain electrode 18; an n+-type drain layer 11 with low resistance, with which drain electrode 18 is in electrical contact; a highly resistive n⁻-type drift layer 12 on n+-type drain layer 11; a p-type base region 13a selectively formed in the surface portion of n⁻-type drift layer 12; a heavily doped n⁺-type source region 14 selectively formed in p-type base region 13a; a gate electrode layer 16 above the extended portion of p-type base region 13a extended between n+-type source region 14 and n⁻-type drift layer 12; a gate oxide film 15 between gate electrode layer 16 and the extended portion of p-type base region 13a; a source electrode 17 in common contact with the surfaces of n⁺-type source region 14 and p-type base region 13a; and a drain electrode 18 on the back surface of n⁺-type drain layer 11.

In the vertical semiconductor device as shown in FIG. 19, highly resistive n⁻-type drift layer 12 works as a region for making a drift current flow vertically when the MOSFET is in the ON-state. Highly resistive n⁻-type drift layer 12 is depleted when the MOSFET is in the OFF-state, resulting in a high breakdown voltage of the MOSFET. Shortening the current path in highly resistive n⁻-type drift layer 12 is effective for substantially reducing the on-resistance (resistance between the drain and the source) of the MOSFET, since the drift resistance is lowered. However, the short current path in n⁻-type drift layer 12 causes breakdown at a low voltage, since the expansion width of the depletion layer that expands from the pn-junction between p-type base region 13a and n⁻-type drift layer 12 is narrowed and the electric field strength soon reaches the maximum (critical) value for silicon. In a semiconductor device with a high breakdown voltage, the characteristically thick n⁻-type drift layer 12 causes high on-resistance and therefore, losses increase. In short, there exists a tradeoff between the on-resistance and the breakdown voltage of the MOSFET. This tradeoff between the on-resistance and the breakdown voltage also exists in other semiconductor devices such as IGBTs, bipolar transistors and diodes. The tradeoff between the on-resistance and the breakdown voltage is also present in lateral semiconductor devices, in which the flow direction of the drift current in the ON-state of the devices is different from the expansion direction of the depletion layer in the OFF-state of the device.

EP0053854, U.S. Pat. No. 5,216,275, U.S. Pat. No. 5,438,215 and Japanese Unexamined Laid Open Patent Application H09 (1997)-266311 disclose semiconductor devices that include a drift layer including heavily doped n-type regions and p-type regions alternately laminated with each other to solve the foregoing problems. The alternately laminated n-type regions and p-type regions are depleted to bear the breakdown voltage in the OFF-state of the device.

FIG. 20 is a cross section of a part of the vertical MOSFET according to an embodiment of U.S. Pat. No. 5,216,275. The vertical MOSFET of FIG. 20 is different from the vertical MOSFET of FIG. 19 in that the vertical MOSFET of FIG. 20 includes a drift layer 22, that is not single-layered, but consists of n-type drift regions 22a and p-type drift regions 22b alternately laminated with each other. In the figure, there is a p-type base region 23a, an n+-type source region 24, a gate electrode 26, a source electrode 27, and a drain electrode 28.

Drift layer 22 is formed in the following manner. First, a highly resistive n-type layer is grown epitaxially on an n⁺-type drain layer 21. The n⁻-type drift regions 22a are formed by etching the highly resistive n-type layer to form trenches down to n⁺-type drain layer 21. Then, p-type drift regions 22b are formed by epitaxially growing p-type layers in the trenches.

Hereinafter, the semiconductor device, including an alternating conductivity type drift layer that makes a current flow in the ON-state of the device and is depleted in the OFF-state of the device, will be referred to as a "semiconductor device with an alternating conductivity type layer."

The dimensions described in U.S. Pat. No. 5,216,275 are as follows. When the breakdown voltage is put in VB, the thickness of the drift layer 22 is $0.024 V_B^{1.2}$ (μm). When n-type drift region 22a and p-type drift region 22b have the same thickness b and the same impurity concentration, the impurity concentration is $7.2 \times 10^{16} V_B^{-0.2}/b$ (cm$^{-3}$). If $V_B$ is 800 V and b μm, the drift layer 22 will be 73 μm in thickness and the impurity concentration $1.9 \times 10^{16}$ cm$^{-3}$. Since the impurity concentration for the single-layered drift layer is around $2 \times 10^{14}$ cm$^{-3}$, the on-resistance is reduced. However, when using conventional epitaxial growth techniques, it is difficult to bury a good quality semiconductor layer in such a narrow and deep trench (with a large aspect ratio).

The tradeoff between the on-resistance and the breakdown voltage is also commonly encountered in lateral semiconductive devices. The foregoing references, EP0053854, U.S. Pat. No. 5,438,215 and Japanese Unexamined Laid Open Patent Application H09(1997)-266311, disclose lateral semiconductor devices with an alternating conductivity type layer and methods, common to the lateral semiconductor devices and vertical semiconductor devices, for forming the alternating conductivity type layer which employ selective etching technique for digging trenches and epitaxial growth techniques for filling the trenches. In manufacturing the lateral semiconductor device, it is relatively easy to employ selective etching techniques and epitaxial growth techniques to form an alternating conductivity type layer, since thin epitaxial layers are laminated one by one.

However, it is difficult to employ the selective etching technique for digging trenches and using an epitaxial growth technique for filling the trenches in manufacturing the vertical semiconductor devices with alternating conductivity type layer as explained with reference to U.S. Pat. No.

5,216,275. Japanese Unexamined Laid Open Patent Application H09 (1997)-266311 describes the nuclear transformation by a neutron beam and such radioactive beams. However, such nuclear transformation processes require large facilities and cannot be used easily.

OBJECTS AND SUMMARY OF THE INVENTION

In view of the foregoing, it is an object of the invention to provide a semiconductor device with alternating conductivity type layer that reduces the tradeoff relation between the on-resistance and the breakdown voltage.

It is another object of the invention to provide a semiconductor device with an alternating conductivity type layer and with a high breakdown voltage that facilitates increasing the current capacity by reducing the on-resistance. It is still another object of the invention to provide a method for manufacturing such a semiconductor device with alternating conductivity type layer easily and with excellent mass-productivity.

According to an aspect of the invention, there is provided a semiconductor device including: a layer with low electrical resistance; a semiconductive substrate region having a first surface contacting the layer with low electrical resistance and a second surface; one or more electrodes on the second surface of the semiconductive substrate region; and an electrode on the surface of the layer with low electrical resistance not contacting the semiconductive substrate layer; the semiconductive substrate region providing a current path when the semiconductor device is ON and being depleted when the semiconductor device is OFF; the semiconductive substrate region including regions of a first conductivity type and regions of a second conductivity type; the regions of the first conductivity type and the regions of the second conductivity type being extended substantially in parallel to each other vertically and arranged alternately with each other horizontally; each of the regions of the first conductivity type including a plurality of second buried regions of the first conductivity type aligned vertically at a predetermined pitch; each of the regions of the second conductivity type including a plurality of first buried regions of the second conductivity type aligned vertically at the predetermined pitch.

Advantageously, the first buried regions and the second buried regions are located at almost the same depths from the surface of the semiconductive substrate region.

Advantageously, the second buried regions are located near the midpoints between the depths, at which the first buried regions are located, from the surface of the semiconductive substrate region.

Since the above described semiconductive substrate region is depleted in the OFF-state of the semiconductor device, the impurity concentrations in the first buried regions or the second buried regions can be increased. Thus, the on-resistance is lowered. Advantageously, the spacing I1 between the centers of the adjacent first buried regions aligned vertically is from 2 to 10 μm. When the spacing $I_1$ exceeds 10 μm, heat treatment should be conducted for an extended period of time to make the first buried regions or the depletion layers which expand from the first buried regions continue to each other. When the spacing $I_1$ is less than 2 μm, growth of the highly resistive layer and impurity doping by ion implantation should be repeated several times, resulting in increased manufacturing steps which are generally undesirable for mass-production.

Advantageously, a relational expression $0.5d \leq I_1 \leq 2d$ holds for the spacing $I_1$ between the centers of the adjacent first buried regions aligned vertically and the average spacing 2d between the centers of the horizontally adjacent first buried regions.

If one assumes that the impurities diffuse evenly in all directions, the upper buried regions and the lower buried regions continue to each other and, at the same time, the first buried regions and the second buried regions continue to each other, then $I_1$ should approximately equal d. If $I_1$ differs significantly from d, heat treatment should be conducted for an extended period of time to make the upper buried regions and the lower buried regions continue to each other after the first buried regions and the second buried regions have continued to each other or to make the first buried regions and the second buried regions continue after the upper buried regions and the lower buried regions have continued to each other. Thus, $I_1$ being significantly different from d is not desirable from the view point of efficient manufacturing. Therefore, the desirable range for $I_1$ is between 0.5d and 2d.

Advantageously, a relational expression $I_0 < I_1$ holds for the spacing $I_0$ between the upper surface of the layer with low electrical resistance and the center of the lowermost first buried region and the spacing $I_1$ between the centers of the adjacent first buried regions aligned vertically.

If $I_0$ is close to $I_1$, the highly resistive region remains with about half the original thickness left. The remaining highly resistive region causes increased on-resistance. Therefore, it is preferable for $I_0$ to be much smaller than $I_1$.

Advantageously, the first buried regions aligned vertically continue to each other.

Since the first buried regions of the second conductivity type are disposed to expand depletion layers into the second buried regions of the first conductivity type, the vertically aligned first buried regions can be separated as long as the spaces between them are narrow enough to make the depletion layers continuous. However, the first buried regions surely work as intended when they continue to each other.

Advantageously, the second buried regions aligned vertically continue to each other.

Since the vertically aligned second buried regions provide a drift current path, the highly resistive layer between them results in increased on-resistance. Therefore, it is desirable for the vertically aligned second buried regions to continue to each other. Since the second buried regions of the first conductivity type are disposed to expand the depletion layers into the first buried regions of the second conductivity type;, the vertically aligned second buried regions can be separated as long as the spaces between them are narrow enough to make the depletion layers continuous. The second buried regions also work as intended when they continue to each other.

Advantageously, the first buried regions and the second buried regions are formed with stripes extending horizontally. Advantageously, the first buried regions are formed with a lattice or a honeycomb extending horizontally, and the second buried regions are in the horizontally lattice-shaped first buried regions or in the bores of the horizontally honeycomb-shaped first buried regions. Alternatively, the second buried regions are formed with a lattice or a honeycomb extending horizontally, and the first buried regions are in the horizontally lattice-shaped second buried regions or in the bores of the horizontally honeycomb-shaped second buried region. Advantageously, the first buried regions are distributed on the lattice points of a rectangular lattice, a triangular lattice or a hexagonal lattice, and the second buried region is between the horizontally adjacent first buried regions. Alternatively, the first buried regions are distributed on the lattice points of a rectangular lattice, a triangular lattice or a hexagonal lattice, and the second buried region is in the center of the unit lattice of the rectangular lattice, the triangular lattice or the hexagonal lattice.

Any patterns and configurations are acceptable so long as the selected pattern facilitates expanding the depletion layers into the first buried regions and the second buried regions. Advantageously, the average spacing 2d between the centers of the horizontally adjacent first buried regions is from 2 to 20 µm.

When an impurity is diffused for about 0.3 µm from a window opened in the surface of the epitaxial layer of about 0.4 µm in width, which is the limit of the conventional lithographic techniques, 2d is about 2 µm. When 2d exceeds 20 µm, the impurity concentrations should be around $2 \times 10^{15}$ $cm^{-3}$ to deplete the first buried regions and the second buried regions by applying a voltage of around 300V. When the impurity concentration is about $2 \times 10^{15}$ $cm^{-3}$, it is not effective at reducing the on-resistance.

According to another aspect of the invention, the first buried regions and the second buried regions are formed by diffusing respective impurities into a highly resistive layer laminate epitaxially grown on the layer with low electrical resistance. By the above described manufacturing method, the semiconductor device with an alternating conductivity type layer is easily manufactured without requiring trenches with a high aspect ratio and filling the trenches with buried regions. In the semiconductor device manufactured by the method according to the invention, impurity concentration distributions are caused in the first buried regions and the second buried regions by the impurity diffusion from limited impurity sources.

BRIEF DESCRIPTION OF THE DRAWINGS

FIG. 2($b$) is a cross section along B-B of the semiconductor device with alternating conductivity type layer of FIG. 1.

FIG. 3($b$) is an impurity distribution profile along C-C of FIG. 1.

FIG. 3($c$) is an impurity distribution profile along D-D of FIG. 1

Now the present invention will be described hereinafter with reference to the accompanying drawing figures which illustrate the preferred embodiments of the invention.

DETAILED DESCRIPTION OF PREFERRED EMBODIMENTS

First Embodiment

Figure 1:
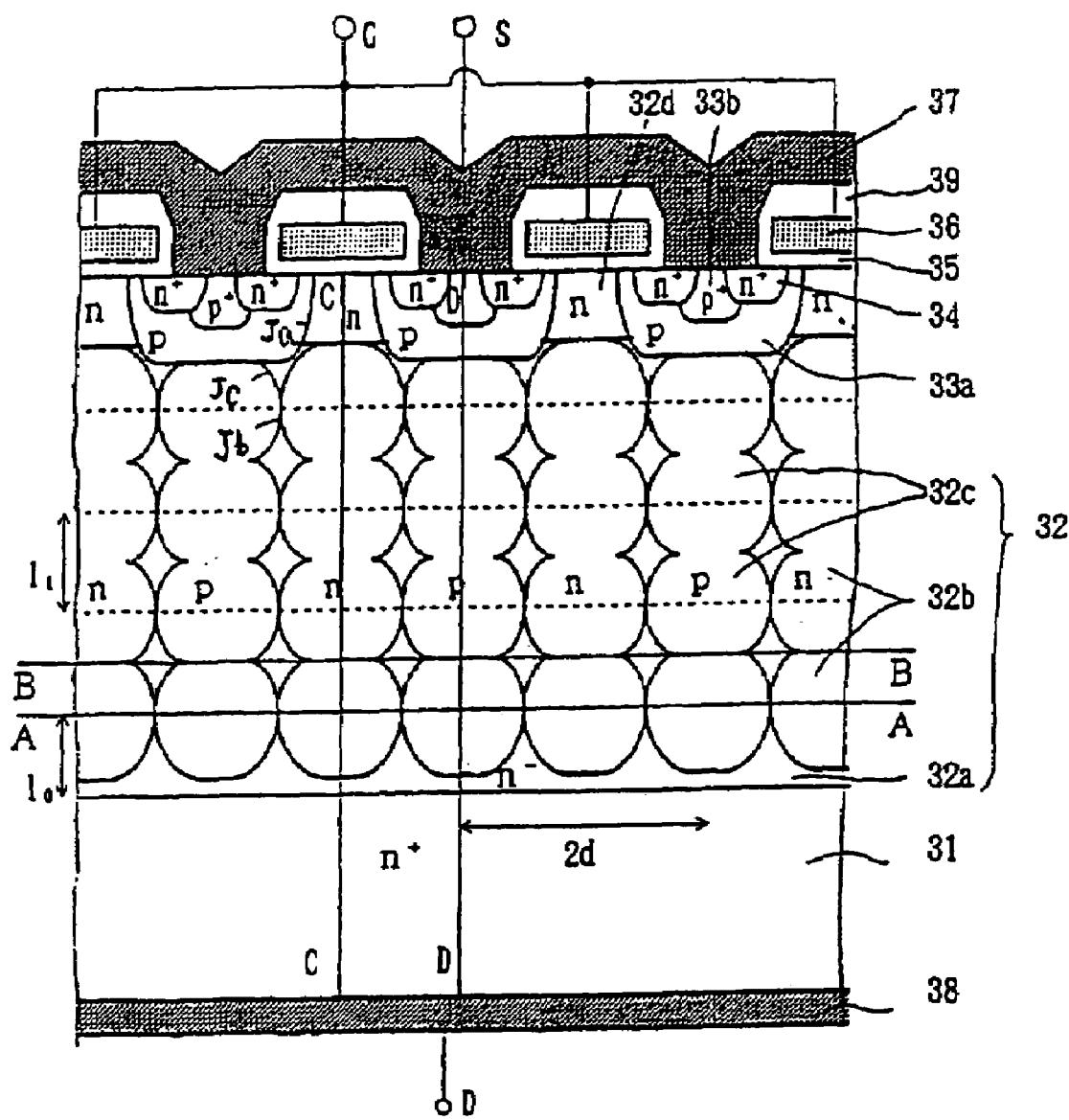
FIG. 1 is a cross section of a semiconductor device with an alternating conductivity type layer according to a first embodiment of the invention.
Figure 2:
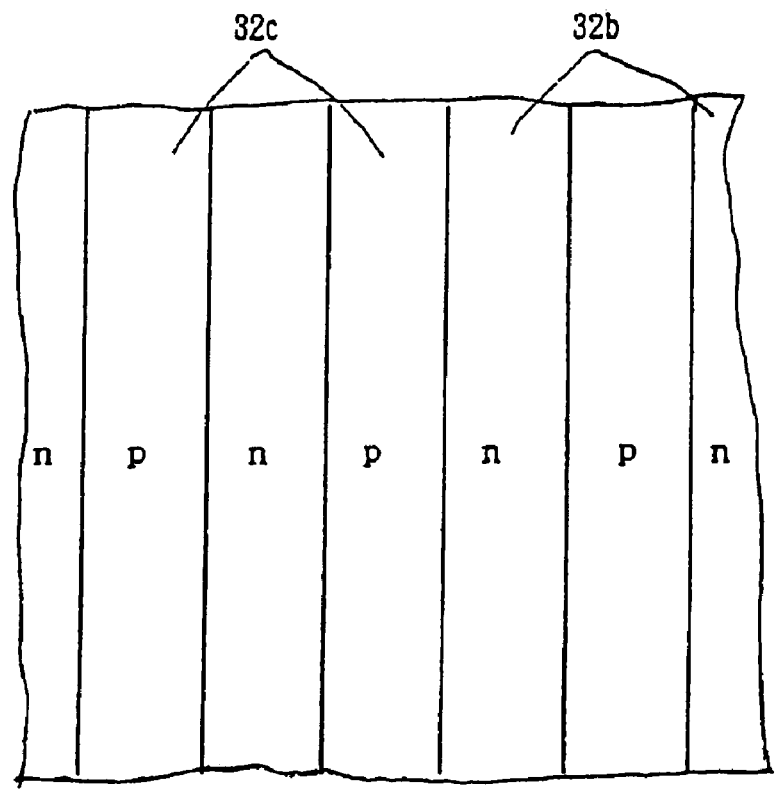
FIG. 2($a$) is a cross section along A-A of the semiconductor device with an alternating conductivity type layer of FIG. 1.
Figure 2:
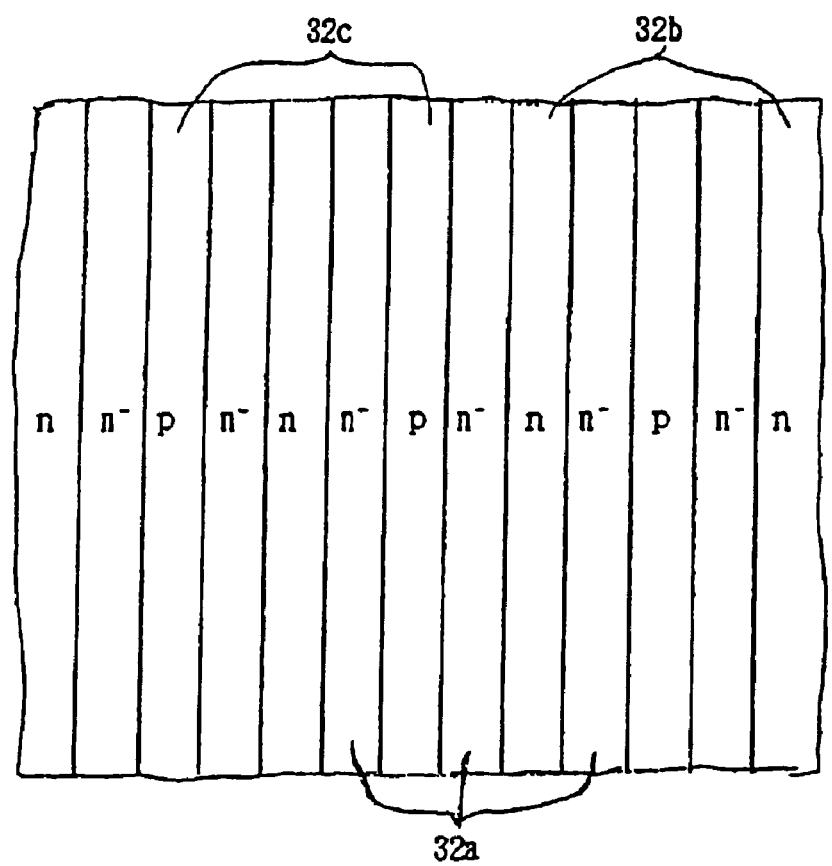

FIG. 1 is a cross section of a semiconductor device with an alternating conductivity type layer according to a first embodiment of the invention. FIG. 2($a$) is a cross section along A-A of the semiconductor device with an alternating conductivity type layer of FIG. 1. FIG. 2($b$) is a cross section along B-B of the semiconductor device with an alternating conductivity type layer of FIG. 1.

Referring now to FIG. 1, a semiconductive substrate region 32 is formed on an $n^+$-type, low resistance, drain layer 31. Semiconductive substrate region 32 includes a highly resistive $n^-$-type layer 32$a$, a plurality of vertical alignments of n-type buried regions 32$b$ and a plurality of vertical alignments of p-type buried regions 32$c$. The vertical alignments of n-type buried regions 32$b$ and the vertical alignments of p-type buried regions 32$c$ are alternately arranged with each other horizontally. An n-type channel layer 32$d$ is in contact with the uppermost n-type buried region 32$b$. A p-type base region 33$a$ is in contact with the uppermost p-type buried region 32$c$. An $n^+$-type source region 34 and a heavily doped p+-type well region 33$b$ are in p-type base region 33a. A gate electrode layer 36 is above the extended portion of p-type base region 33a extended between n+-type source region 34 and n-type channel layer 32d with a gate insulation film 35 interposed therebetween. A source electrode 37 is in contact with both n+-type source region 34 and p+-type well region 33b. A drain electrode 38 is on the back surface of n+-type drain layer 31. Source electrode 37 can be extended over gate electrode layer 36 with an insulation film 39 interposed therebetween as shown in FIG. 1. Although the drift current flows through n-type buried regions 32b and highly resistive n$^+$-type layers 32a, the semiconductive substrate region 32 including p-type buried regions 32c, will be collectively referred to hereinafter as the "drift layer".

Broken lines in FIG. 1 indicate the planes at which the formation of the semiconductive substrate region 32 is interrupted and where impurities are implanted. The n-type buried regions 32b and p-type buried regions 32c are formed by impurity diffusion from the respective impurity sources implanted into the central portions of n-type buried regions 32b and p-type buried regions 32c. Although the pn-junctions between n-type buried regions 32b and p-type buried regions 32c are represented by curves in FIG. 1 (curved surfaces three-dimensionally) due to their formation technique described above, the pn-junctions between n-type buried regions 32b and p-type buried regions 32c tend to gradually straighten (to be flat planes three-dimensionally) as the heat treatment period for diffusion is extended.

As illustrated in FIG. 2(a), n-type buried regions 32b and p-type buried regions 32c extend horizontally as stripes. In FIG. 2(a), n-type buried regions 32b and p-type buried regions 32c are in contact to each other. In FIG. 2(b), i.e., along B-B of FIG. 1, n-type buried regions 32b and p-type buried regions 32c are not in contact with each other, the regions being separated with the highly resistive n$^-$-type layer 32a left therebetween. The highly resistive n$^-$-type layer 32a between n-type buried regions 32b and p-type buried regions 32c may be narrowed and ultimately fade away by extending the time period of the heat treatment subsequent to ion implantation.

Figure 3A:
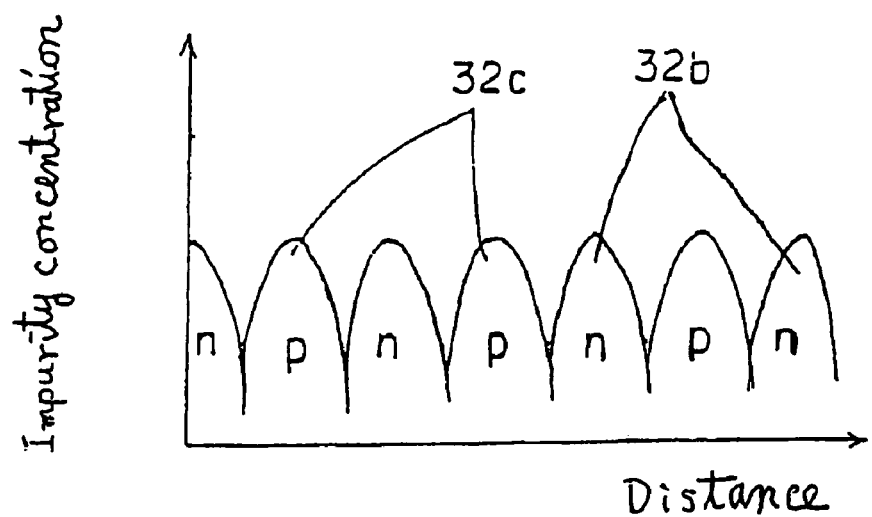
FIG. 3($a$) is an impurity distribution profile along A-A of FIG. 1.
Figure 3B:
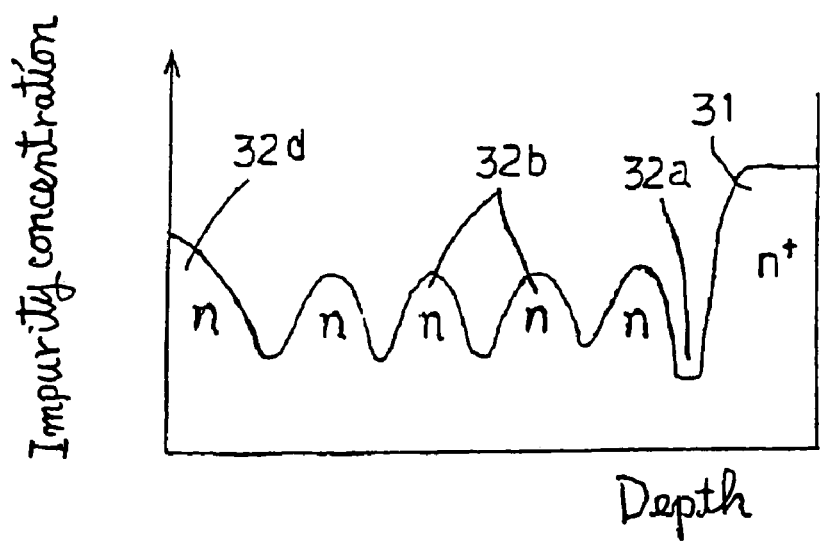
Figure 3C:
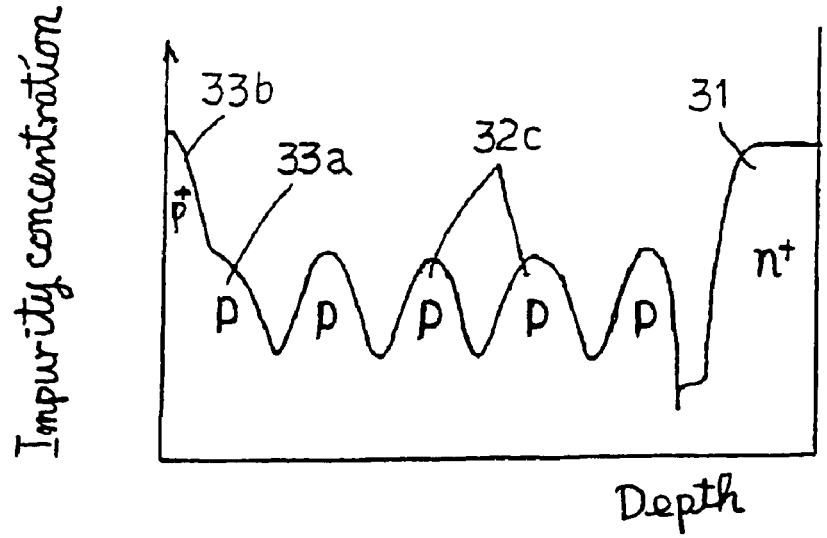

FIG. 3(a) is an impurity distribution profile along A-A of FIG. 1. FIG. 3(b) is an impurity distribution profile along C-C of FIG. 1. FIG. 3(c) is an impurity distribution profile along D-D of FIG. 1. In these figures, the vertical axis represents the logarithmic impurity concentration. In FIG. 3(a), the impurity distributions caused by the diffusion from the respective impurity sources of n-type buried regions 32b and p-type buried regions 32c arranged alternately are repeated. In FIG. 3(b), the impurity distributions caused by the diffusion from the diffusion sources of n-type buried regions 32b are continuous and repeated vertically above n+-type drain layer 31 with low resistance. Impurity distribution is also caused in n-type channel region 32d on the uppermost n-type buried region 32b by the diffusion from the surface of n-type channel region. In FIG. 3(c), the impurity distributions caused by the diffusion from the diffusion sources of p-type buried regions 32c are continuous and repeated vertically above n+-type drain layer 31 with low resistance. Impurity distributions are also caused in p-type base region 33a and p$^+$-type well region 33b continuous to the uppermost p-type buried region 32c by the diffusion from their surfaces.

The semiconductor device with an alternating conductivity type layer of FIG. 1 operates as follows. When a predetermined positive voltage is applied to gate electrode layer 36, an inversion layer is caused in the surface portion of p-type base region 33a beneath gate electrode layer 36. The electrons injected to p$^+$-type channel region 33b from n$^+$-type source region 34 via the inversion layer reach n$^+$-type drain layer 31 via n-type buried regions 32b, resulting in electrical conduction between drain electrode 38 and source electrode 37.

As the positive voltage is removed from gate electrode layer 36, the inversion layer induced in the surface portion of p-type base region 33a vanishes, and the drain 38 and the source 37 are electrically disconnected from each other. As the reverse bias voltage is further boosted, depletion layers expand into n-type buried regions 32b and p-type buried regions 32c from the pn-junctions Ja between p-type base regions 33a and n-type channel regions 32d, the pn-junctions Jb between p-type buried regions 32c and n-type buried regions 32b and the pn-junctions Jc between p-type buried regions 32c and highly resistive n$^-$-type layer 32a. Thus, n-type buried regions 32b and p-type buried regions 32c are depleted.

The n-type buried regions 32b are depleted very quickly, since the edges of the depletion layers from the pn-junctions Jb and Jc advance in the width direction of n-type buried regions 32b and since depletion layers also expand into n-type buried regions 32b from p-type buried regions 32c on both sides of n-type buried regions 32b. Therefore, n-type buried regions 32b may be heavily doped.

The p-type buried regions 32c are depleted simultaneously with n-type buried regions 32b. The p-type buried regions 32c are depleted very quickly, since depletion layers expand into p-type buried regions 32c from both sides of the regions. Since the edges of the depletion layer from p-type buried region 32c enter adjacent n-type buried regions 32b by virtue of the alternating arrangement of p-type buried regions 32c and n-type buried regions 32b, the total width occupied by p-type buried regions 32c for forming depletion layers may be halved. Accordingly, the cross sectional area of n-type buried regions 32b may be widened.

The dimensions and the impurity concentrations for an exemplary MOSFET of the 300 V class are as follows. The thickness of n$^+$-type drain layer 31 is 0.01 μm. The thickness of n+-type drain layer 31 is 350 μm. The specific resistance of highly resistive n$^-$-type drain layer 32a is 10 Ω·cm. The thickness of drift layer 32 is 25 μm (5 μm each for $I_0$, $I_1$, ...). The n-type buried region 32b and p-type buried region 32c are 5 μm in width: the spacing between the centers of the buried regions with the same conductivity type is 10 μm. The average impurity concentration in the n-type buried regions 32b and p-type buried regions 32c is $7 \times 10^{15}$ cm$^{-3}$. The diffusion depth of p-type base region 33a is 1 μm. The surface impurity concentration of p-type base region 33a is $3 \times 10^{18}$ cm$^{-3}$. The diffusion depth of n+-type source region 34 is 0.3 μm. The surface impurity concentration of n$^+$-type source region 34 is $1 \times 10^{20}$ cm$^{-3}$.

To provide a conventional vertical MOSFET with a breakdown voltage of about 300 V, it is necessary for a single-layered highly resistive drift layer to contain an impurity concentration of around $2 \times 10^{14}$ cm$^{-3}$ and to be about 40 μm in thickness. In the MOSFET with an alternating conductivity type layer according to the first embodiment of the invention, its on-resistance is reduced to one fifth of that of the conventional vertical MOSFET by increasing the impurity concentration in n-type buried regions 32b and by reducing the thickness of the drift layer 32 in accordance with the increment of the impurity concentration.

The on-resistance is further reduced and the tradeoff relation between the on-resistance and the breakdown voltage is further improved by reducing the width of n-type buried regions 32b and by further increasing its impurity concentration.

The MOSFET with an alternating conductivity type layer according to the first embodiment of the invention results in a novel structure of drift layer 32. Since the n-type buried regions 32b and p-type buried regions 32c of drift layer 32 in the MOSFET according to the invention are formed by impurity diffusion, impurity distributions are caused in drift layer 32 by such diffusion.

FIGS. 4(a) through 4(d) and FIGS. 5(a) and 5(b) are cross sections describing the steps for manufacturing the MOSFET with alternating conductivity type layer according to the first embodiment of the invention.

Figure 4A:
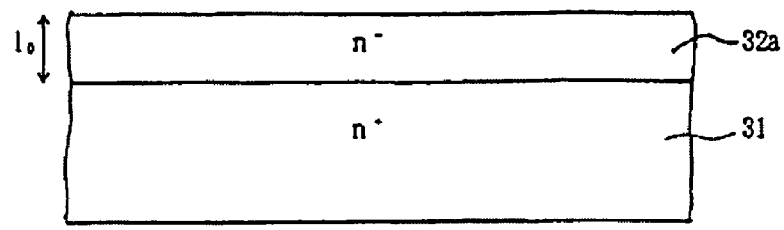
FIGS. 4($a$) through 4($d$) are cross sections describing the steps for manufacturing the MOSFET with an alternating conductivity type layer according to the first embodiment of the invention.

Referring now to FIG. 4(a), a highly resistive n⁻-type layer 32a is grown on an n⁺-type drain layer 31 that works as an n-type substrate with low resistance. In this embodiment, the thickness $I_0$ of n⁻-type layer 32a deposited at first is set at about 4 μm.

Figure 4B:
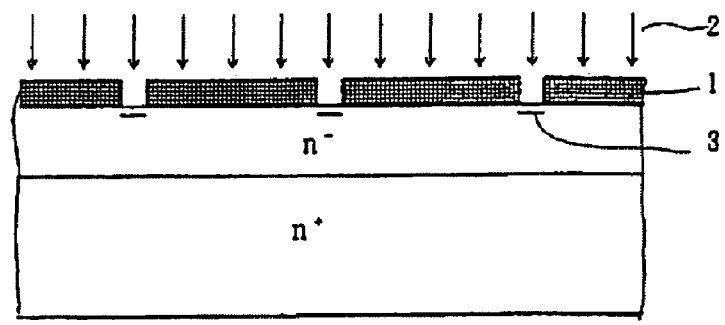

Referring now to FIG. 4(b), a photoresist mask pattern 1 is formed on the n⁻-type layer 32a and boron ions (hereinafter referred to as "B ions" 2 are implanted under the acceleration voltage of 50 keV and at the dose amount of $1 \times 10^{13}$ cm⁻². The implanted B ions are designated by the reference numeral 3.

Figure 4C:
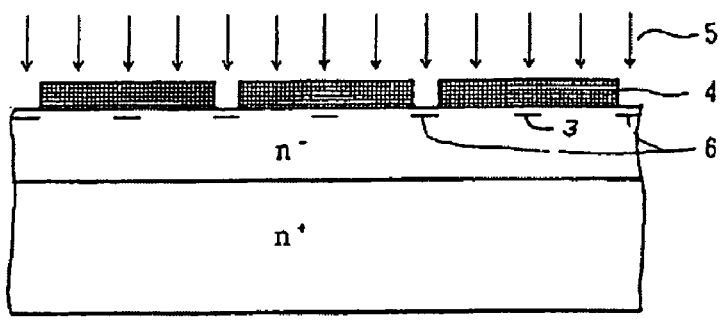

Referring now to FIG. 4(c), a photoresist mask pattern 2 is formed on the n⁻-type layer 32a and phosphorus ions (hereinafter referred to as "P ions" 5 are implanted under the acceleration voltage of 50 keV and at the dose amount of $1 \times 10^{13}$ cm⁻². The implanted P ions are designated by the reference numeral 6.

Figure 4D:
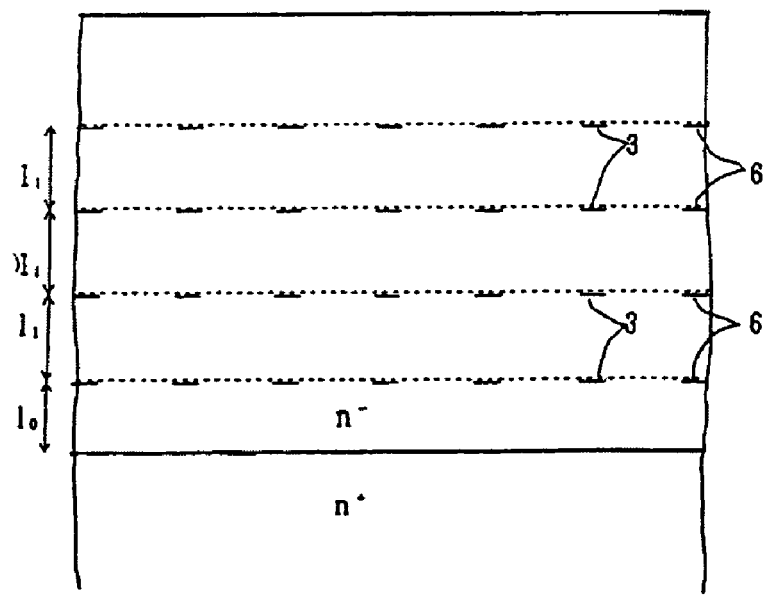

Referring now to FIG. 4(d), an additional highly resistive n⁻-type layer 32a is grown to the thickness of $I_1$, photoresist mask patterns are formed, and B and P ions are implanted in a similar manners as described above with reference to FIGS. 4(a) through 4(c). These steps are repeated until drift layer 32 has been grown to the predetermined thickness. In this embodiment, the thickness $I_1$ of the additional highly resistive n⁻-type layers is set at 5 μm and three additional n⁻-type layers are laminated. And, a layer for forming a surface portion is grown on the uppermost highly resistive n⁻-type layer.

Figure 5:
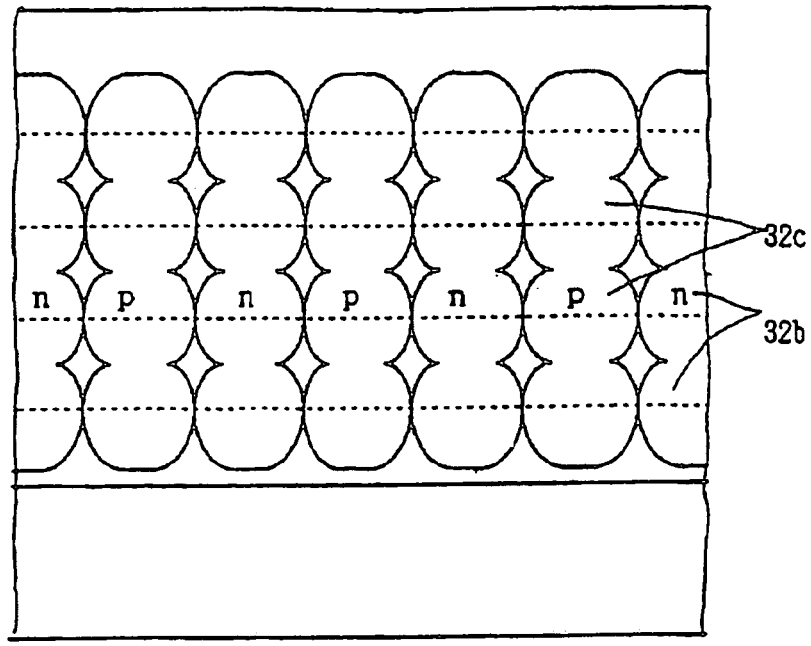
FIGS. 5($a$) and 5($b$) are further cross sections describing the further steps for manufacturing the MOSFET with an alternating conductivity type layer according to the first embodiment of the invention.
Figure 5:
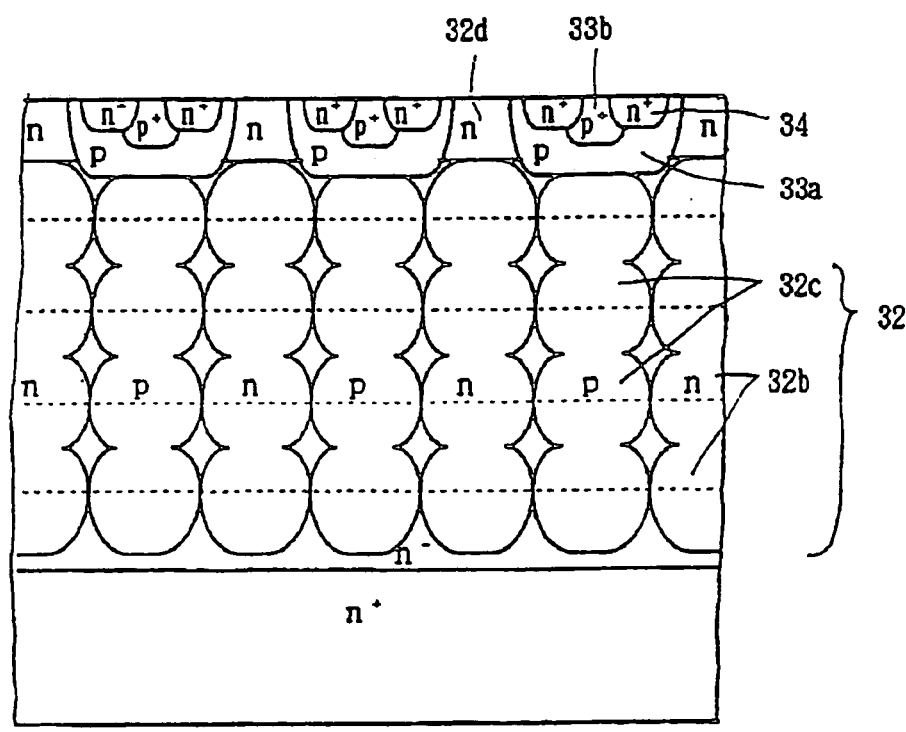

Referring now to FIG. 5(a), n-type buried regions 32b and p-type buried regions 32c are formed by diffusing the implanted impurities by heat treatment conducted at 1150° C. for 5 hr. The impurities diffuse in a region of about 3 μm by this heat treatment, resulting in contact of n-type buried regions 32b and p-type buried regions 32c to each other. The final shapes of n-type buried regions 32b and p-type buried regions 32c may be varied by changing the shape of the masks for ion implantation, the dose amounts of the impurities and the time period of the heat treatment.

Referring now to FIG. 5(b), n-type channel region 32d, p-type base region 33a, n⁺-type source region 34 and p⁺-type well region 33b are formed in the surface portion in the same manner as those in the conventional vertical MOSFET by selective impurity ion implantation and by the subsequent heat treatment. Gate insulation film 35 is then formed by thermal oxidation. Gate electrode layer 36 is formed by depositing polycrystalline silicon film by the vacuum CVD technique and by the subsequent photolithographic process. Then, insulation film 39 is deposited and windows are opened through insulation film 39. Source electrode 37, drain electrode 38 and the not shown metallic portion of the gate electrode are formed by depositing an aluminum alloy layer and by patterning the deposited aluminum alloy layer. Thus, the vertical MOSFET as shown in FIG. 1 is completed.

While it is known to form buried regions by growing epitaxial layers of several μm in thickness and by thermally diffusing implanted impurity ions, the technique employed in the invention facilitates manufacturing the MOSFET with an alternating conductivity type layer that improves the tradeoff between the on-resistance and the breakdown voltage without the need to form trenches with a large aspect ratio and filling each trench with a high-quality epitaxial layer.

Figure 6:
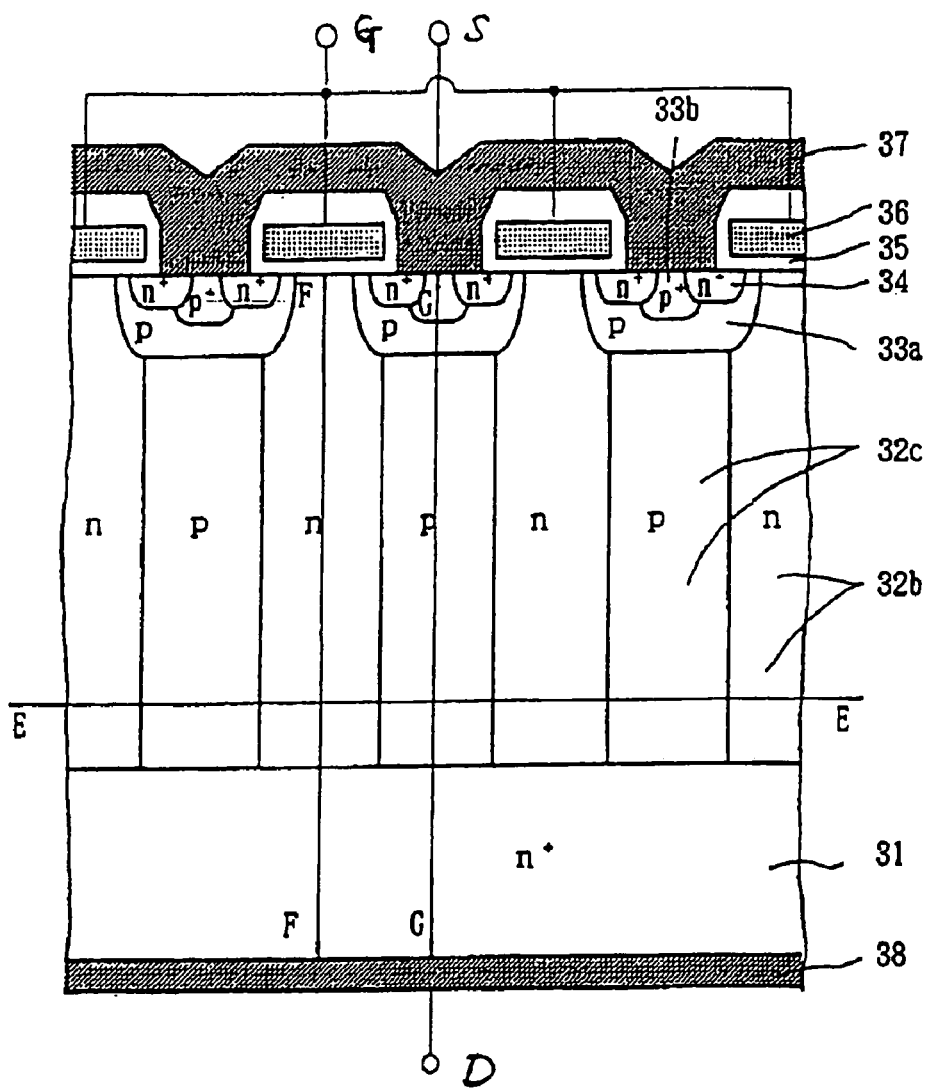
FIG. 6 is a cross section of a modification of the MOSFET with an alternating conductivity type layer according to the first embodiment of the invention.

If highly resistive n⁻-type layer 32a remaining below n-type buried region is thick, the on-resistance will be high. Therefore, the thickness $I_0$ of the epitaxial layer on n⁺-type drain layer 31 is preferably set to be thinner than the thickness $I_1$ of the next epitaxial layer. FIG. 6 is a cross section of a modification of the MOSFET with an alternating conductivity type layer according to the first embodiment of the invention. This modified MOSFET is manufactured by extending the time period for the heat treatment following the impurity ion implantation and the epitaxial growth described with reference to FIG. 4(d). Due to the extended heat treatment, highly resistive n⁻-type layer 32a has been eliminated and adjacent n-type buried regions 32b and p-type buried regions 32c are contacting each other over most of their entire side faces, resulting in substantially flat boundaries. The resulting flat boundaries between n-type buried regions 32b and p-type buried regions 32c are illustrated by straight lines in FIG. 6.

Figure 20:
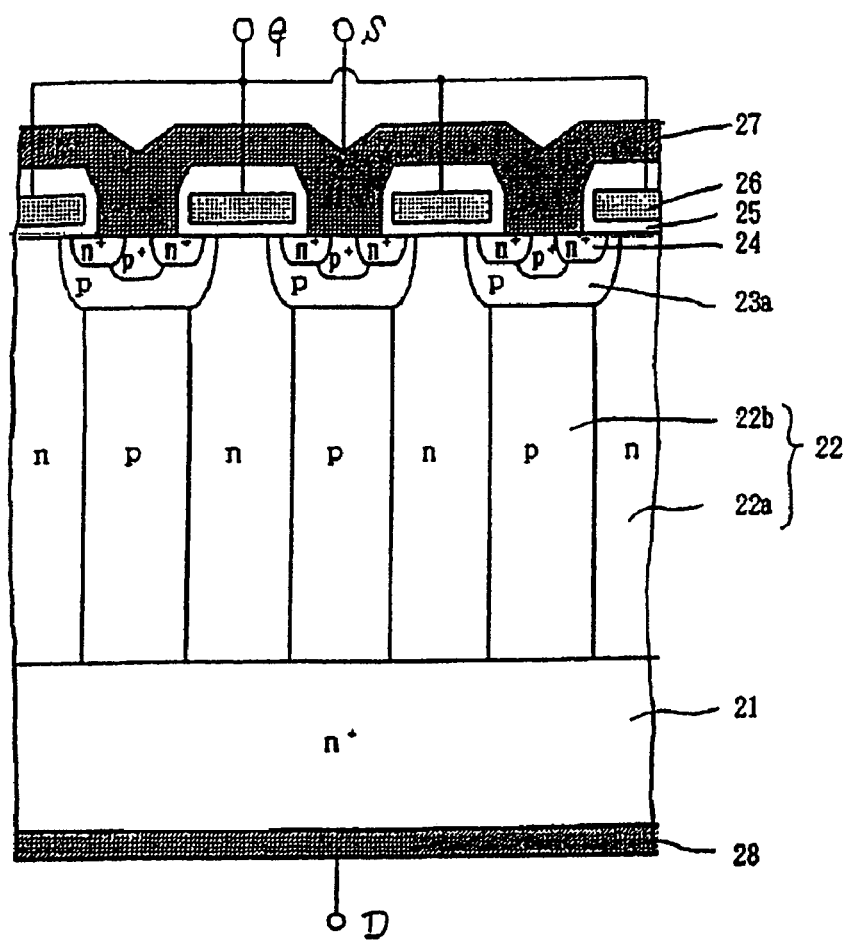
FIG. 20 is a cross section of a part of the vertical MOSFET according to an embodiment of U.S. Pat. No. 5,216,275.

The cross section shown in FIG. 6 for the modification resembles the cross section shown in FIG. 20 for the conventional MOSFET. However, their internal semiconductor structure are different from each other. In FIG. 20, the impurity concentration is almost uniform in each epitaxial layer, since the epitaxial layers are formed by growing a first epitaxial layer and by filling the trenches dug in the first epitaxial layer with second epitaxial layers. In contrast, the impurity distribution profiles along section lines E-E, F-F and G-G of FIG. 6 are essentially the same with those described in FIG. 3(a), FIG. 3(b), and FIG. 3(c), respectively. The impurity distribution due to highly resistive n⁻-type layer 32a does not appear in the profiles along E-E, F-F and G-G of FIG. 6, since any resistive n⁻-type layer 32a is not remaining in FIG. 6. the impurity distribution profile along E-E of FIG. 6 includes the impurity distributions across n-type buried regions 32b and p-type buried regions 32c alternately arranged with each other horizontally. The impurity distribution profile along lines F-F of FIG. 6 includes the impurity distribution across n+ drain layer 31, cyclic concentration change due to the diffusion from the sources in n-type buried regions 32b and the impurity distribution across n-type channel region 32d in the surface portion. The impurity distribution profile along G-G of FIG. 6 includes the impurity distribution across n+ drain layer 31, cyclic concentration change due to the diffusion from the sources in p-type buried regions 32c, the impurity distribution across p-type base region 32a and the impurity distribution across p⁺-type well region 33b in the surface portion.

Figure 7:
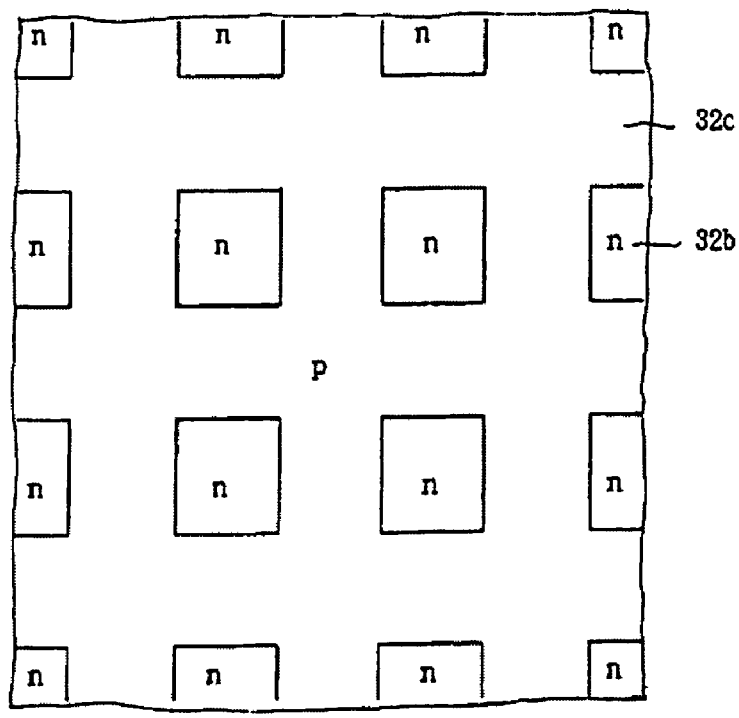
FIG. 7 is a top plan view showing an example of a planar arrangement of the first buried region and the second buried region.
Figure 8:
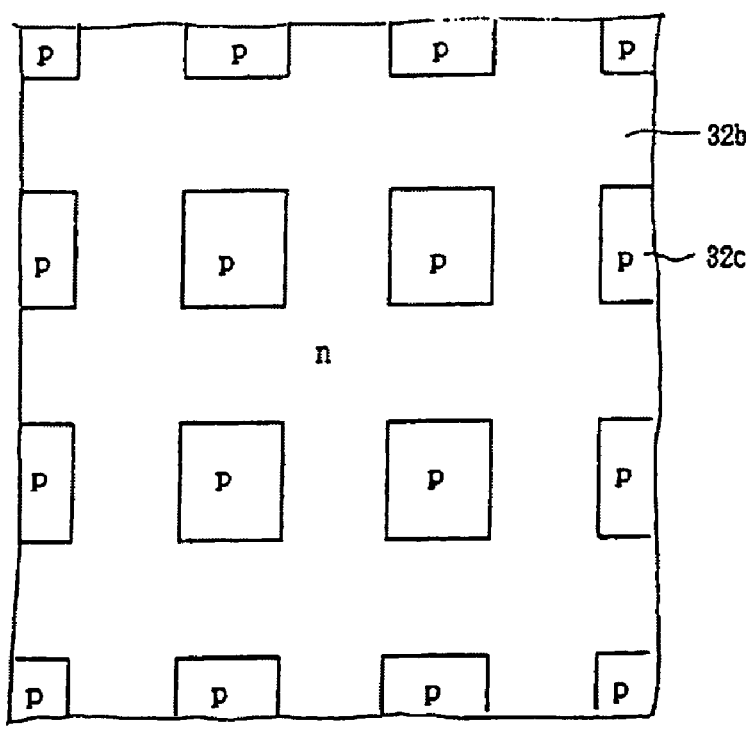
FIG. 8 is a top plan view showing another example of a planar arrangement of the first buried region and the second buried region.

Although n-type buried regions 32b and p-type buried regions 32c are arranged in stripes horizontally in the first embodiment of the invention, n-type buried regions 32b and p-type buried regions 32c may be arranged in different fashions. FIGS. 7 through 12 show various planar arrangements of n-type buried regions 32b and p-type buried regions 32c. In FIG. 7, a matrix of rectangular n-type buried regions 32b is arranged in p-type buried region 32c. In FIG.

8, a matrix of rectangular p-type buried regions 32c is arranged in n-type buried region 32b. Alternatively, n-type buried region 32b or p-type buried region 32c is shaped with a honeycomb, the bores of which are filled with p-type buried regions 32c or n-type buried regions 32b.

Figure 9:
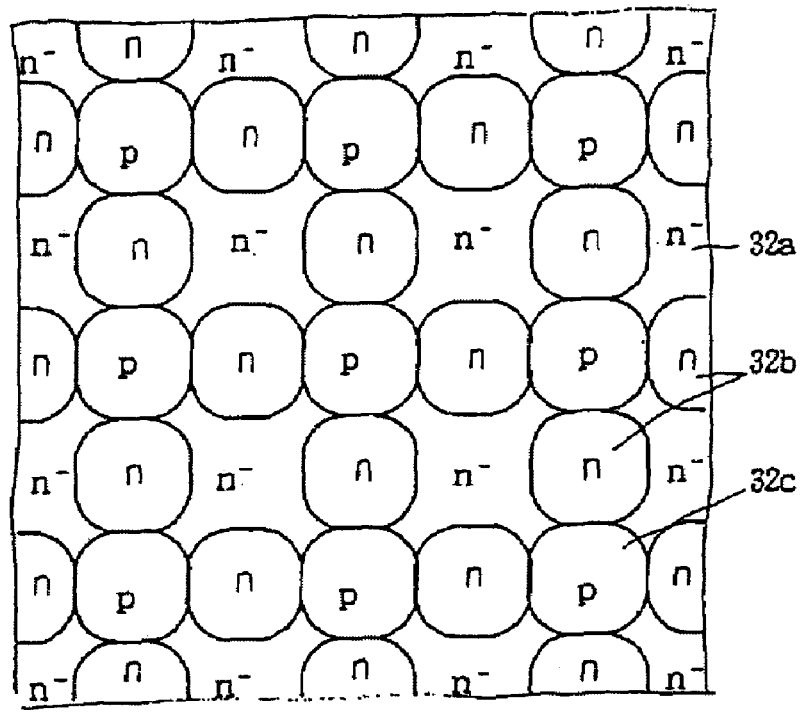
FIG. 9 is a top plan view showing still another example of planar arrangement of the first buried region and the second buried region.
Figure 10:
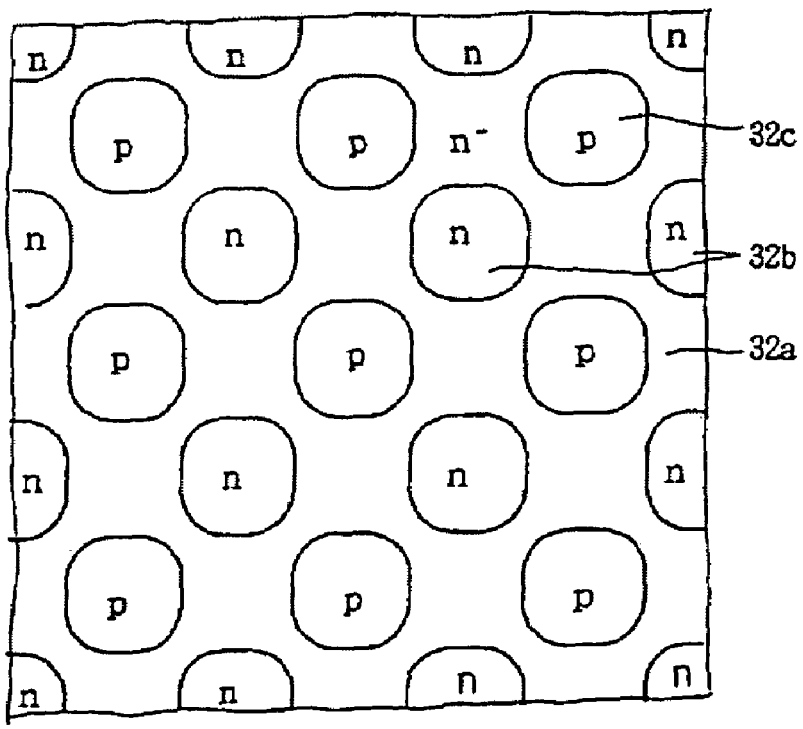
FIG. 10 is a top plan view showing a further example of planar arrangement of the first buried region and the second buried region.
Figure 11:
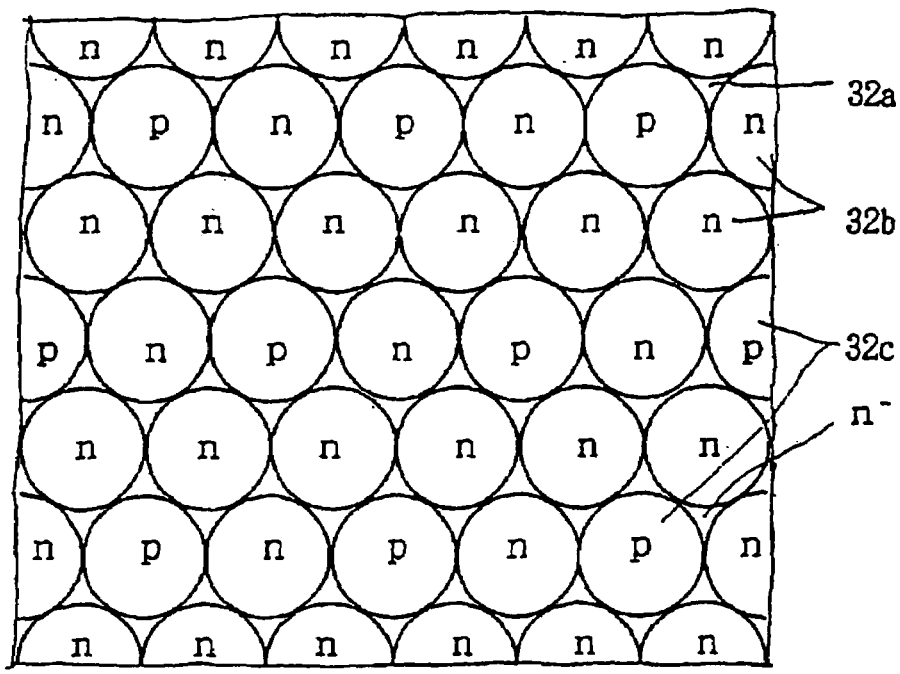
FIG. 11 is a top plan view showing a still further example of a planar arrangement of the first buried region and the second buried region.
Figure 12:
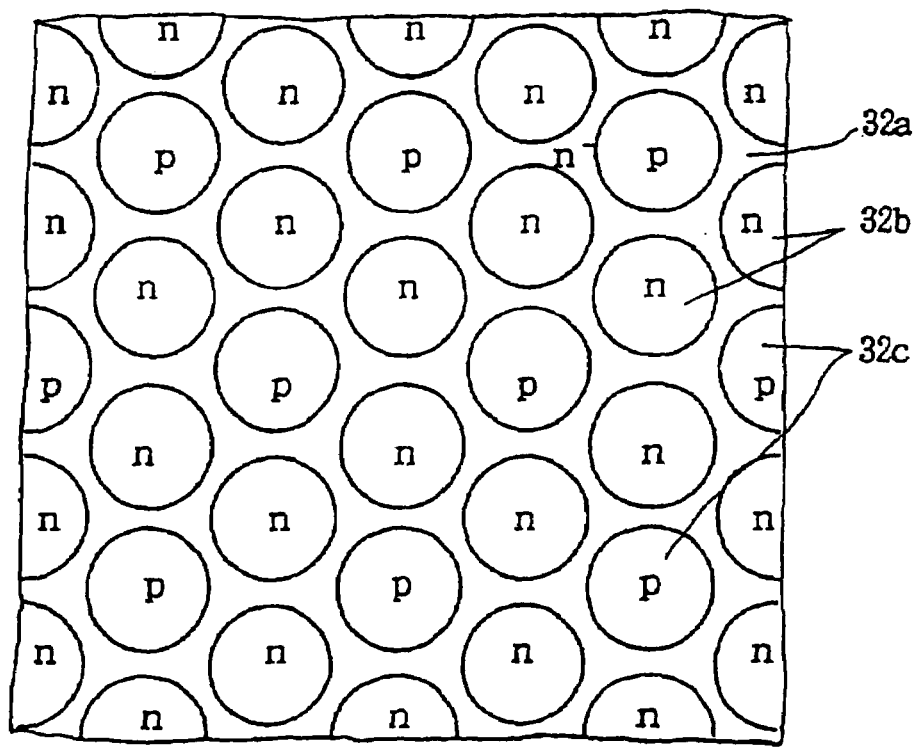
FIG. 12 is a top plan view showing the other example of planar arrangement of the first buried region and the second buried region.

FIGS. 9 through 12 show the examples of scattered arrangement. In FIG. 9, p-type buried regions 32c are arranged at the lattice points of a square lattice and n-type buried region 32b is arranged between adjacent p-type buried regions 32c. In FIG. 10, p-type buried regions 32c are arranged at the lattice points of a square lattice and n-type buried region 32b is arranged in the center of each unit lattice. In FIG. 11, p-type buried regions 32c are arranged at the lattice points of a triangular lattice and n-type buried region 32b is arranged between adjacent p-type buried regions 32c. In FIG. 12, p-type buried regions 32c are arranged at the lattice points of a triangular lattice and n-type buried region 32b is arranged in the center of the unit lattice. In these arrangements, the spacing between n-type buried region 32b and p-type buried region 32c is narrowed by extending the time period for heat treatment conducted following epitaxial growth and impurity ion implantation. In some cases, a p-type layer may be used in substitution for highly resistive n$^-$-type layer 32a. Other various repetitive arrangements may be adopted in addition to those disclosed with particularity herein.

It is not always necessary to shape p-type base region 33a in the surface portion and p-type buried region 32c with similar planar patterns. The p-type base region 33a and p-type buried region 32c may be shaped with quite different respective patterns so long as they are connected to each other. For example, p-type base region 33a and p-type buried region 32c may be shaped with respective stripe patterns, which extend perpendicularly to each other.

In any arrangement, the contact area between n-type buried regions 32b and p-type buried regions 32c is widened gradually as the time period for thermal diffusion is extended and highly resistive n$^-$-type layer 32a is narrowed gradually until it finally vanishes.

In the first embodiment, heat treatment is employed for inducing diffusion and connecting the upper and lower n-type buried regions 32b. When the highly resistive layer is n$^-$-type layer 32a, it is not always necessary to connect the upper and lower n-type buried regions 32b. However, n$^-$-type layer 32a remaining between n-type buried regions 32b increases the on-resistance. It is not always necessary to connect the upper and lower p-type buried regions 32c so long as they are spaced apart with a distance short enough for the depletion layers to join each other.

Second Embodiment

Figure 13:
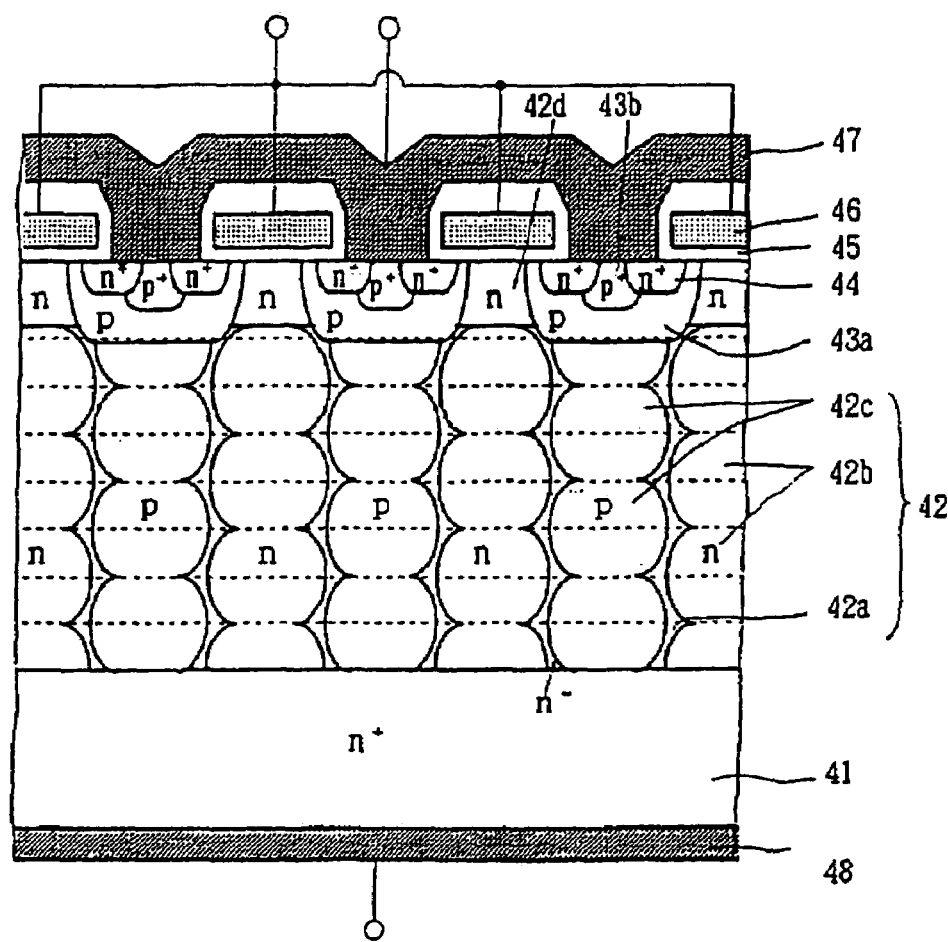
FIG. 13 is a cross section of a semiconductor device with an alternating conductivity type layer according to a second embodiment of the invention.

FIG. 13 is a cross section of a semiconductor device with alternating conductivity type layer according to a second embodiment of the invention.

Referring now to FIG. 13, a drift layer 42 is on an n$^+$-type drain layer 41 with low resistance. Drift layer 42 includes a highly resistive layer 42a, a plurality of vertical alignments of n-type buried regions 42b and a plurality of vertical alignments of p-type buried regions 42c. The vertical alignments of n-type buried regions 42b and the vertical alignments of p-type buried regions 42c are alternately arranged with each other horizontally. In the surface portion of drift layer 42, n-type channel layers 42d are formed on the uppermost n-type buried regions 42b and p-type base regions 43a on the uppermost p-type buried regions 42c. An n$^+$-type source region 44 and a heavily doped p$^+$-type well region 43b are in p-type base region 43a. A gate electrode layer 46 is above the extended portion of p-type base region 43a extended between n$^+$-type source region 44 and n-type channel layer 42d with a gate insulation film 45 interposed therebetween. A source electrode 47 is in contact with both the n$^+$-type source region 44 and the heavily doped p$^+$-type well region 43b. A drain electrode 48 is on the back surface of n+-type drain layer 41.

The MOSFET with alternating conductivity type layer according to the second embodiment of the invention is different from the MOSFET with an alternating conductivity type layer according to the first embodiment in the way of forming its drift layer and the resulting structure of the drift layer. In the second embodiment, the n-type buried regions 42b and the p-type buried regions 42c are formed by the diffusion of the respective impurities implanted in the surface portions of different epitaxial layers.

It is not always necessary to implant the impurities for the n-type buried regions and the p-type buried regions at the same depth, as in the first embodiment. The n-type buried regions 42b and p-type buried regions 42c may be at different depths.

The MOSFET with an alternating conductivity type layer according to the second embodiment of the invention exhibits the same effects as those of the MOSFET with an alternating conductivity type layer according to the first embodiment. The MOSFET with an alternating conductivity type layer that improves the tradeoff relation between the on-resistance and the breakdown voltage according to the second embodiment is manufactured by epitaxial growth and impurity diffusion techniques without the need to form trenches with a large aspect ratio and filling each trench with a high-quality epitaxial layer.

The n-type buried regions 42b and the p-type buried regions 42c may be arranged two dimensionally in a stripe pattern, in a lattice pattern, or in a scattered fashion in the second and following embodiments in the same manner as in the first embodiment. In the second embodiment, it is not always necessary for the highly resistive layer 42a to be of n-type and a highly resistive p-type layer is also acceptable, since n-type buried regions 42b are in contact with n+-type drain layer 41. When the highly resistive layer 42a is of a p-type, it is not necessary for the upper and lower p-type buried regions 42c to be in contact with each other.

Third Embodiment

Figure 14:
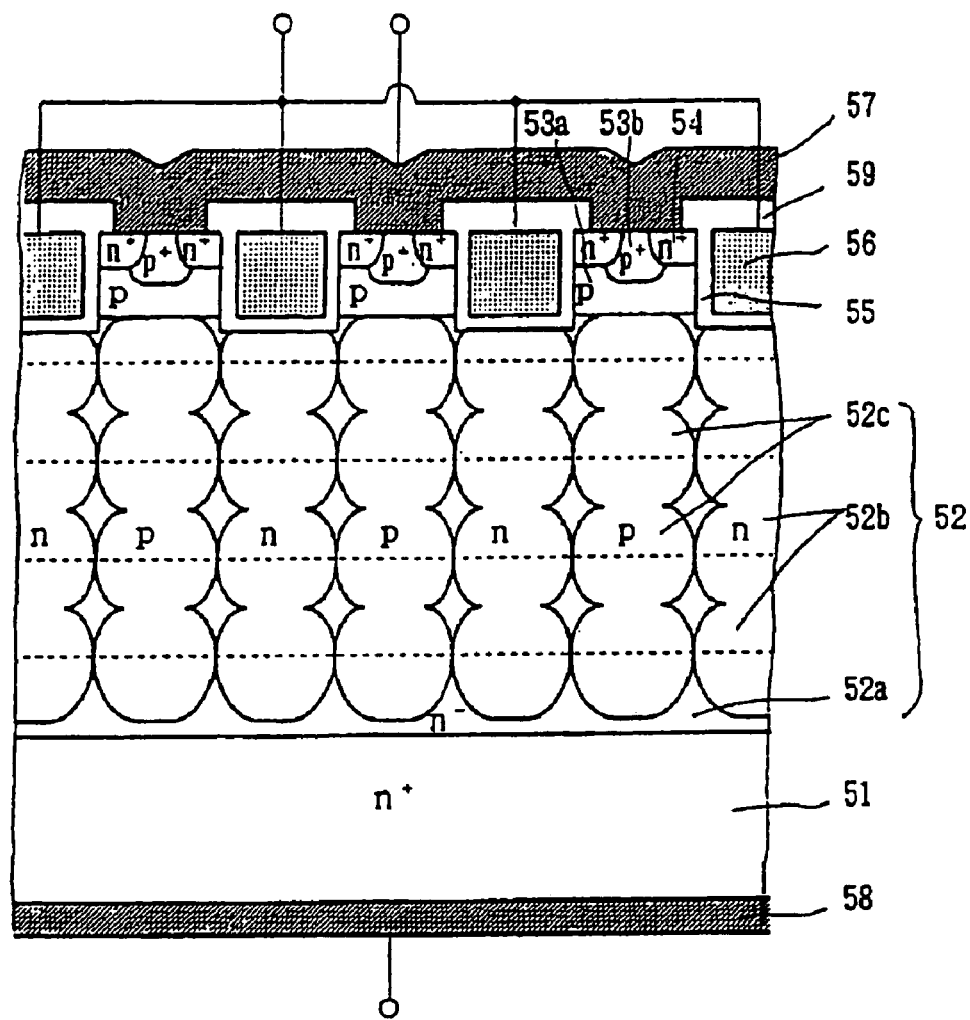
FIG. 14 is a cross section of a semiconductor device with an alternating conductivity type layer according to a third embodiment of the invention.

FIG. 14 is a cross section of a semiconductor device with an alternating conductivity type layer according to a third embodiment of the invention.

The semiconductor device shown in FIG. 14 is a UMOSFET that includes trench gates. The gate structure of the UMOSFET is different from that of the MOSFET according to the first embodiment. Referring now to FIG. 14, trenches are dug in the surface portion of a drift layer 52. A gate electrode layer 56 is surrounded by a gate insulation film 55 in the trench. In the remaining surface portion of drift layer 52, p-type base layers 53a are formed in the depth as shallow as that of gate electrode layer 56, and n+ source regions 54 are formed along the upper edges of gate electrode layers 56. A thick insulation film 59 covers gate electrode layers 56. Drift layer 52 includes a plurality of vertical alignments of n-type buried regions 52b and a plurality of vertical alignments of p-type buried regions 52c, in a similar manner as in the foregoing embodiments. The vertical alignments of n-type buried regions 52b and the vertical alignments of p-type buried regions 52c are alternately arranged with each other horizontally.

In the third embodiment, n-type buried region 52b and p-type buried region 52c have dimensions and impurity concentrations which are approximately the same as those described in connection with the first embodiment. When a reverse bias voltage is applied, drift layer 52 is depleted to bear the breakdown voltage.

Since n-type buried regions 52b and p-type buried regions 52c are easily depleted, they can be doped heavily. The drift layer 52 can be thinned by virtue of the heavy doping to n-type buried regions 52b and p-type buried regions 52c, thus the on-resistance is reduced and the tradeoff relation between the on-resistance and the breakdown voltage is improved. By using techniques such as epitaxial growth and impurity diffusion, the UMOSFET with an alternating conductivity type layer that improves the tradeoff relation between the on-resistance and the breakdown voltage is easily manufactured.

Fourth Embodiment

Figure 15:
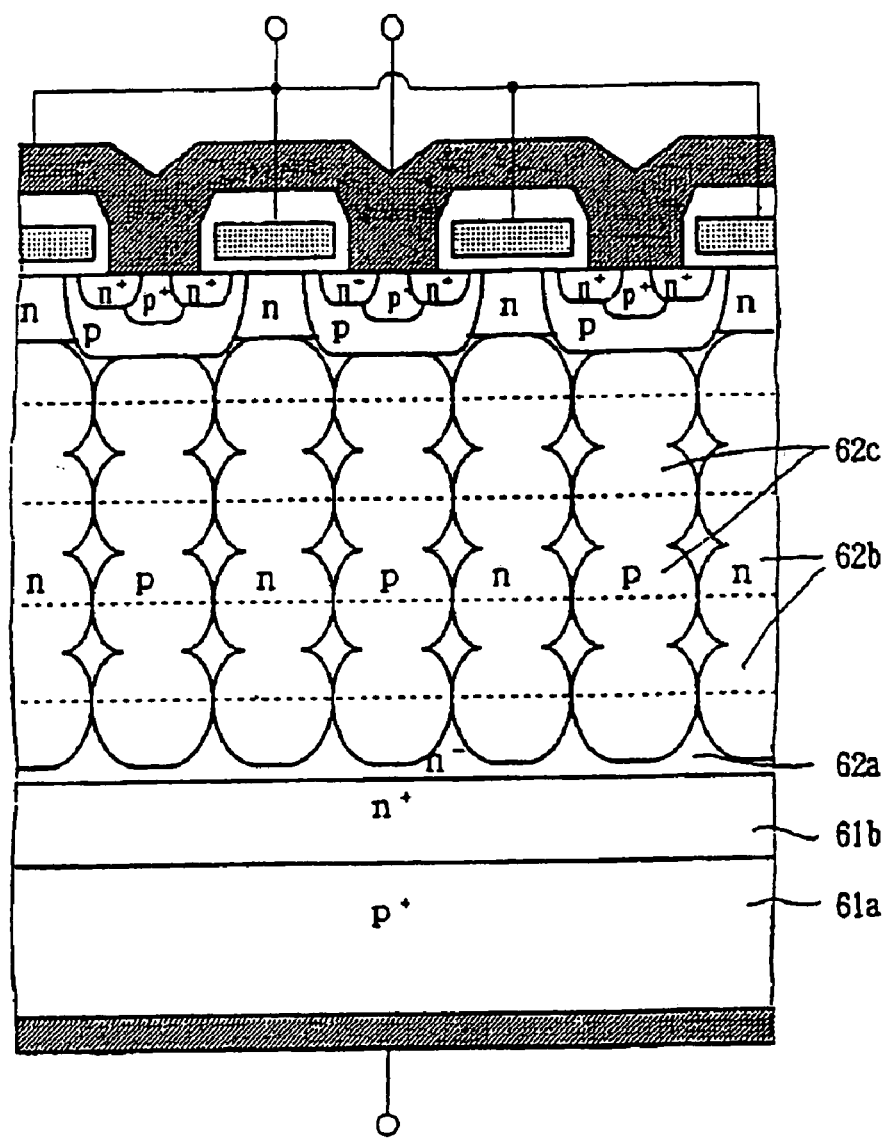
FIG. 15 is a cross section of a semiconductor device with an alternating conductivity type layer according to a fourth embodiment of the invention.

FIG. 15 is a cross section of a semiconductor device with an alternating conductivity type layer according to a fourth embodiment of the invention.

The semiconductor device shown in FIG. 15 is an n-channel IGBT. The drain layer structure of the IGBT is different from that of the MOSFET according to the first embodiment. In detail, this n-channel IGBT is obtained by adopting a binary layer structure consisting of a $p^+$-type drain layer 61a and an n+-type buffer layer 61b in substitution for single-layered $n^+$-type drain layer 21 of the MOSFET with alternating conductivity type layer. In some cases, $n^+$-type buffer layer 61b may be omitted. The IGBT of FIG. 15 includes a drift layer 62 including a plurality of vertical alignments of n-type buried regions 62b and a plurality of vertical alignments of p-type buried regions 62c, similar to that described in the foregoing embodiments. The vertical alignments of n-type buried regions 62b and the vertical alignments of p-type buried regions 62c are alternately arranged with respect to each other horizontally.

Since the IGBT is a semiconductor device of conductivity modulation type based on minority carrier injection, its on-resistance is much smaller than that of the MOSFET based on the drift of majority carriers. Even so, the on-resistance of the IGBT is further reduced by thinning drift layer 62.

A p-type substrate with low resistance is used for $p^+$-type drain layer 61a. An epitaxial layer for $n^+$-type buffer layer 61b is grown on the p-type substrate with low resistance and, then, drift layer 62 is formed on $n^+$-type buffer layer 61b by epitaxial growth and impurity diffusion.

The techniques employed in the fourth embodiment facilitate manufacturing the IGBT with alternating conductivity type layer that improves the tradeoff relation between the on-resistance and the breakdown voltage without requiring trenches with a large aspect ratio and then filling each trench with a high-quality epitaxial layer.

Fifth Embodiment

Figure 16:
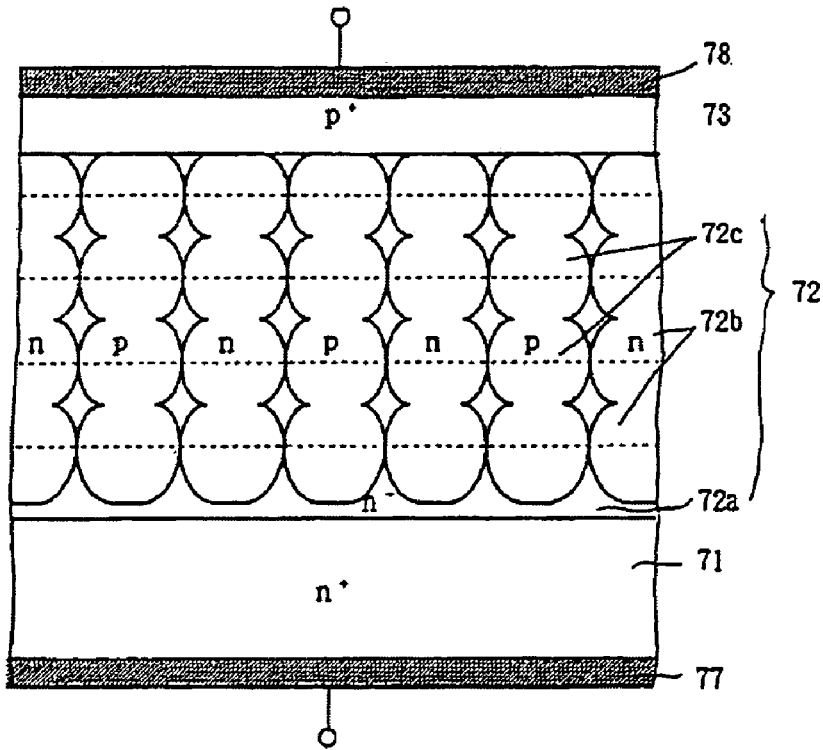
FIG. 16 is a cross section of a semiconductor device with an alternating conductivity type layer according to a fifth embodiment of the invention.

FIG. 16 is a cross section of a semiconductor device with an alternating conductivity type layer according to a fifth embodiment of the invention.

The semiconductor device of FIG. 16 is a diode that includes an $n^+$-type cathode layer 71 with low resistance and a drift layer 72. Drift layer 72 includes a highly resistive $n^-$-type layer 72a, a plurality of vertical alignments of n-type buried regions 72b and a plurality of vertical alignments of p-type buried regions 72c. The vertical alignments of n-type buried regions 72b and the vertical alignments of p-type buried regions 72c are alternately arranged with each other horizontally. A $p^+$-type anode layer 73 is on drift layer 72. An anode electrode 78 is in contact with $p^+$-type anode layer 73. A cathode electrode 77 is in contact with $n^+$-type cathode layer 71.

In the fifth embodiment, n-type buried regions 72b and p-type buried regions 72c have dimensions and impurity concentrations about the same as those set forth in the first embodiment. When a reverse bias voltage is applied, drift layer 72 is depleted to bear the breakdown voltage.

Since n-type buried regions 72b and p-type buried regions 72c are easily depleted, they can be doped heavily. Since drift layer 72 can be thinned by virtue of the heavy doping to n-type buried regions 52b and p-type buried regions 52c, the on-resistance is reduced and the tradeoff relation between the on-resistance and the breakdown voltage is improved.

Steps similar to those described with reference to FIGS. 4(a) through 4(d) are employed for manufacturing the diode of FIG. 16. Then, $p^+$-type anode layer 73 is formed by ion implantation and subsequent diffusion. Finally, anode electrode 78 and cathode electrode 77 are formed.

Thus, a diode which exhibits a high breakdown voltage and a low on-resistance is manufactured easily by quite general epitaxial growth and subsequent impurity diffusion.

Sixth Embodiment

Figure 17:
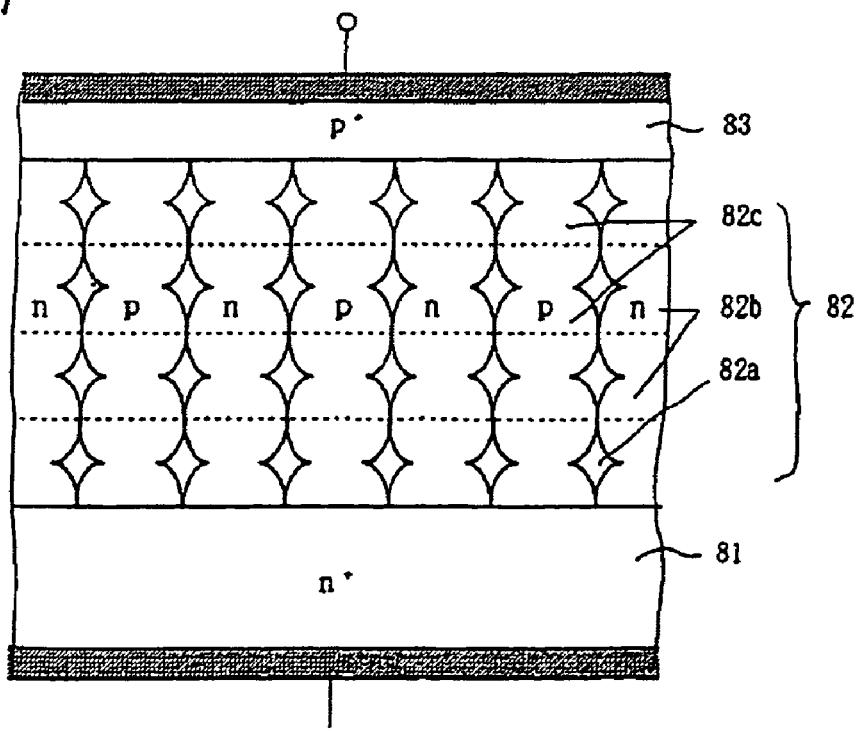
FIG. 17 is a cross section of a semiconductor device with an alternating conductivity type layer according to a sixth embodiment of the invention.

FIG. 17 is a cross section of a semiconductor device with an alternating conductivity type layer according to a sixth embodiment of the invention.

The semiconductor device of FIG. 17 is another diode embodiment, which includes a drift layer 82, that is different from drift layer 72 of the fifth embodiment. Although drift layer 82 includes a highly resistive $n^-$-type layer 82a, a plurality of vertical alignments of n-type buried regions 82b and a plurality of vertical alignments of p-type buried regions 82c, the lowermost plane and the uppermost plane, in which the impurity concentrations are highest, contact with an $n^+$-type cathode layer 81 and a $p^+$-type anode layer 83, respectively. In the sixth embodiment, n-type buried regions 82b and p-type buried regions 82c have the dimensions and impurity concentrations about the same as those described in the first embodiments. When a reverse bias voltage is applied, drift layer 82 is depleted to bear the breakdown voltage.

The diode of FIG. 17 reduces its on-resistance and improves the tradeoff relation between the breakdown voltage and the on-resistance in the same way as the diode of FIG. 16 does.

The diode which exhibits a high breakdown voltage and a low on-resistance is manufactured easily in the same way as the diode of FIG. 16.

Seventh Embodiment

Figure 18:
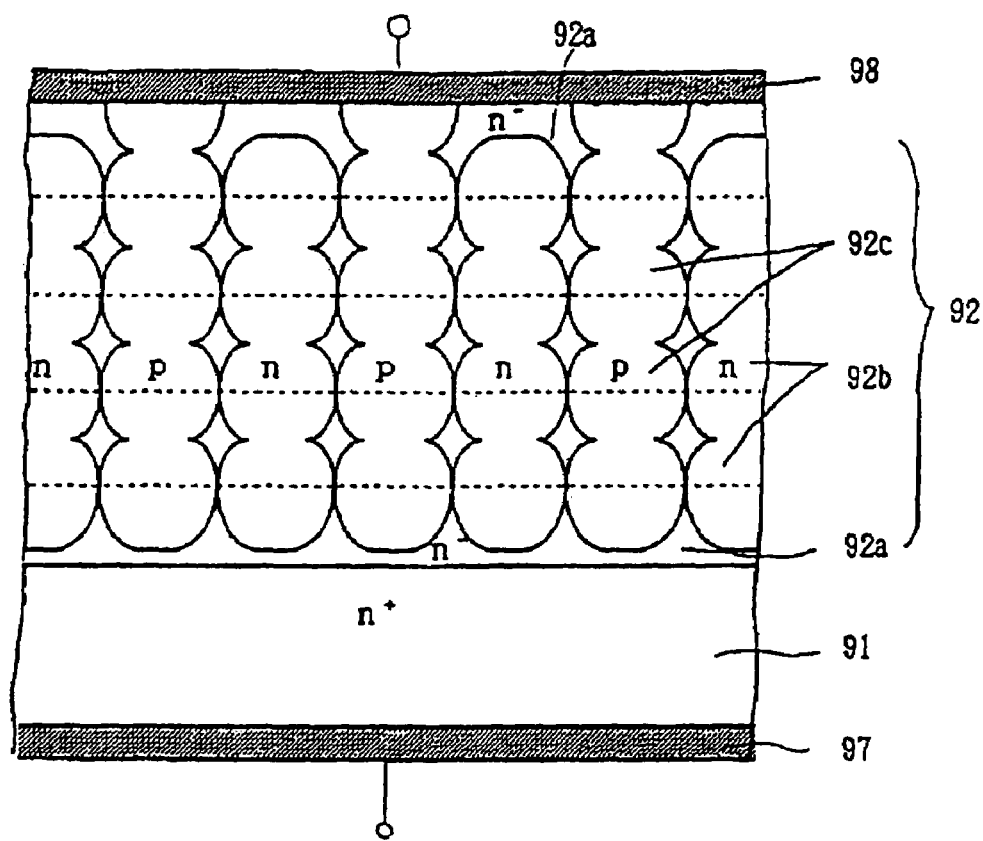
FIG. 18 is a cross section of a semiconductor device with an alternating conductivity type layer according to a seventh embodiment of the invention.
Figure 19:
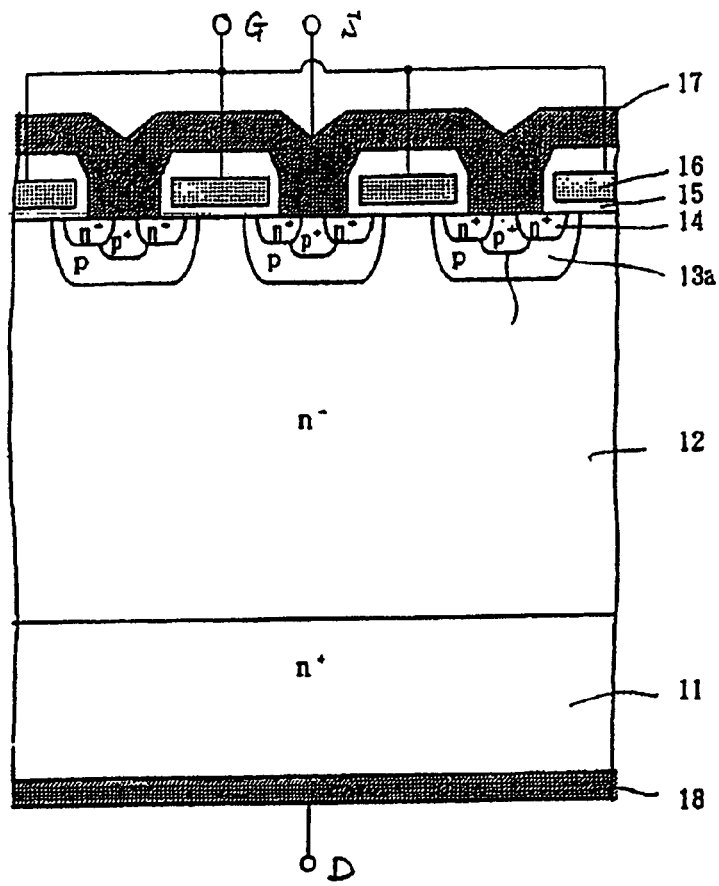
FIG. 19 is a cross section of a conventional planar n-channel vertical MOSFET.

FIG. 18 is a cross section of a semiconductor device with alternating conductivity type layer according to a seventh embodiment of the invention.

The semiconductor device of FIG. 18 is a Schottky diode that includes an $n^+$-type cathode layer 91 and a drift layer 92. Drift layer 92 includes a highly resistive $n^-$-type layer 92a, a plurality of vertical alignments of n-type buried regions 92b and a plurality of vertical alignments of p-type buried regions 92c. The vertical alignments of n-type buried regions 92b and the vertical alignments of p-type buried regions 92c are alternately arranged with each other horizontally. Some parts of highly resistive n⁻-type layers 92a are remaining in the surface portion of drift layer 92, and the uppermost p-type buried regions 92c are extended to the surface of drift layer 92. A Schottky electrode 98 is on drift layer 92 such that Schottky barrier is formed between the Schottky electrode 98 and the remaining portion of highly resistive n⁻-type layer 92a remaining in the surface portion of drift layer 92. A cathode electrode 97 is on the back surface of n⁺-type cathode layer 91.

In the Schottky diode with an alternating conductivity type layer according to the seventh embodiment, n-type buried regions 92b and p-type buried regions 92c have the dimensions and impurity concentrations almost same as those in the first embodiments. When a reverse bias voltage is applied, drift layer 92 is depleted to bear the breakdown voltage. Since n-type buried regions 92b and p-type buried regions 92c are easily depleted, they can be doped heavily. Since the thickness of the drift layer 92 can be reduced by virtue of the heavy doping to n-type buried regions 92b and p-type buried regions 92c, the on-resistance is reduced and the tradeoff relation between the on-resistance and the breakdown voltage is improved.

Steps similar to those described with reference to FIGS. 4(a) through 4(d) are employed for manufacturing the Schottky diode of FIG. 18. Finally, Schottky electrode 98 and cathode electrode 97 are formed.

Thus, a Schottky diode that exhibits a high breakdown voltage and a low on-resistance is easily manufactured using general epitaxial growth and subsequent impurity diffusion techniques.

The semiconductor structure with an alternating conductivity type layer according to the invention is applicable to almost all the semiconductor devices such as the MOSFET, IGBT, diode, bipolar transistor, JFET, thyristor, MESFET, and HEMT. The conductivity types may be exchanged appropriately.

As explained above, the semiconductor device according to the invention includes a layer with low electrical resistance; a semiconductive substrate region on the layer with low electrical resistance; one or more electrodes on the surface of the semiconductive substrate region; and an electrode on the back surface of the layer with low electrical resistance; the semiconductive substrate region providing a current path when the semiconductor device is ON and being depleted when the semiconductor device is OFF. The semiconductive substrate region including regions of a first conductivity type and regions of a second conductivity type wherein the regions of the first conductivity type and the regions of the second conductivity type are extended in parallel to each other vertically and arranged alternately with each other horizontally. Each of the regions of the first conductivity type include a plurality of second buried regions of the first conductivity type aligned vertically at a predetermined pitch. Each of the regions of the second conductivity type include a plurality of first buried regions of the second conductivity type aligned vertically at the predetermined pitch.

The semiconductor devices of the invention are manufactured by the method that includes the steps of epitaxially growing a highly resistive layer laminate on the layer with low resistance, and diffusing impurities into the highly resistive layer laminate to form the first buried regions and the second buried regions. The semiconductor device and its manufacturing method according to the invention exhibit the following effects.

By using techniques such as epitaxial growth and impurity diffusion, a characteristic alternating conductivity type layer has been realized without forming trenches with a large aspect ratio and filling each trench with a high-quality epitaxial layer.

The resulting easy depletion of the first buried regions and the second buried regions and the resulting increased impurity concentrations in the first buried regions and the second buried regions facilitate thinning the semiconductive substrate region that includes the alternating conductivity type layer, further resulting in lowered on-resistance, e.g., lowered by 80% from the conventional value, and an improved tradeoff relation between the on-resistance and the breakdown voltage.

By applying the present invention to power devices, novel semiconductor power devices which facilitate dramatically reducing the electrical power loss are realized.

Although the present invention has been described in connection with specific exemplary embodiments, it should be understood that various changes, substitutions and alterations can be made to the disclosed embodiments without departing from the spirit and scope of the invention as set forth in the appended claims.

What is claimed is:

1. A semiconductor device comprising:
   a layer with low electrical resistance;
   a semiconductive substrate region on the layer with low electrical resistance;
   the semiconductive substrate region providing a current path when the semiconductor device is ON and being depleted when the semiconductor device is OFF;
   the semiconductive substrate region comprising regions of a first conductivity type and regions of a second conductivity type and a layer with high electrical resistance, the layer with high electrical resistance being a further semiconductive substrate region between the regions of a first conductivity type and the regions of a second conductivity type;
   the regions of the first conductivity type and the regions of the second conductivity type being arranged alternately with each other, and being in contact with each other;
   a first major surface above the semiconductive substrate region;
   a second major surface on the back surface of the layer with low electrical resistance;
   one or more trenches formed in depth from the first major surface to at least portions of the regions of a first conductivity type of the semiconductive substrate region;
   one or more insulating films are formed inside of the trench; and
   one or more insulators or one or more electrodes are buried in the trenches enough to cover over the entrances of the trenches.

2. The semiconductor device according to claim 1, wherein a portion of a side of the trench is almost perpendicular to the first major surface.

3. The semiconductor device according to claim 1, wherein a most upper portion of the insulator or the electrode buried in the trench is formed by an insulator.

4. The semiconductor device according to claim 1, wherein the regions of the first conductivity type and the regions of the second conductivity type are shaped with stripes in a cross sectional view being in parallel with the first major surface.

* * * * *